April 15, 1969 P. A. MERCOLA 3,439,285
STABILIZED DIRECT-COUPLED AMPLIFIER
Filed Oct. 31, 1966
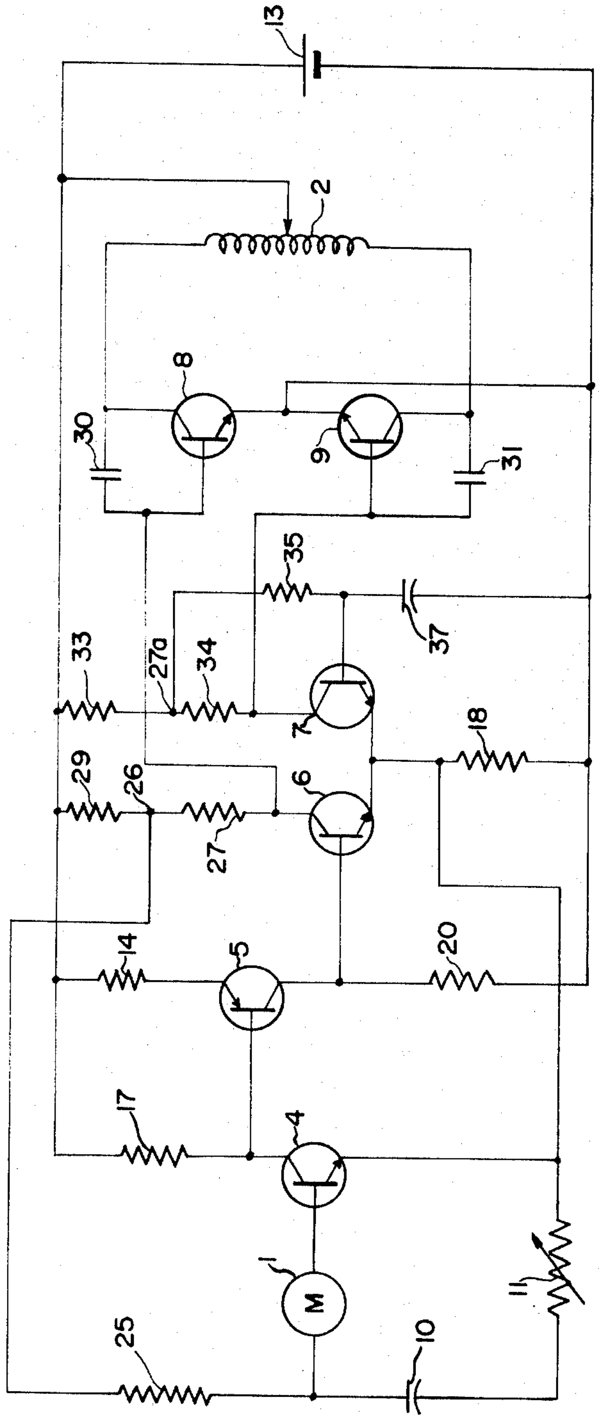
INVENTOR
PETER A. MERCOLA
BY Bair, Freeman & Molinare
ATTORNEYS United States Patent Office 3,439,285
Patented Apr. 15, 1969

3,439,285
STABILIZED DIRECT-COUPLED AMPLIFIER

Peter A. Mercola, Wilmette, Ill., assignor to Beltone Electronics Corporation, a corporation of Illinois Filed Oct. 31, 1966, Ser. No. 590,714
Int. Cl. H03f *3/18, 3/26, 3/68*
U.S. Cl. 330—15 5 Claims

ABSTRACT OF THE DISCLOSURE

A direct-coupled transistor amplifier having a Class B, push-pull output stage driven by a phase-splitting differential amplifier. The quiescent operating points of both the output transistors and the driving transistors are stabilized by the provision of direct current degenerative feedback between the collector and base circuits of each transistor in the differential amplifier. The transistors selected for the differential amplifier have temperature characteristics similar to those of the transistors used in the push-pull output amplifier; in consequence, the operating points of the output transistors are also accurately stabilized.

*Background and summary of the invention*

This invention relates to electrical signal amplifying system and, more particularly, to an arrangement for stabilizing the operating characteristics of a direct-coupled transistor amplifier.

A pair of transistors, like their vacuum tube counterparts, may be connected in a Class-B configuration where one transistor conducts for one half of the input signal cycle and the other conducts for the other half. The two half-cycles are then combined to form an amplified replica of the input waveform. The Class-B push-pull amplifier possesses several significant advantages. It is highly efficient since the transistors drain current from the power supply only when an input signal is applied. When the two transistors are well matched, the push-pull amplifier configuration is capable of excellent linearity.

Through the use of the well known direct-coupling technique transistor amplifiers may be constructed which eliminate the need for interstage blocking capacitors. The elimination of such coupling capacitors provides improved frequency response as well as the possibility of more complete miniaturization, particularly in integrated circuits where such capacitors may constitute the principal bulk of the amplifier. However, because of the direct-coupled circuit's ability to amplifier direct-current as well as alternating-current signals, extreme care must be taken to stabilize the quiescent operating point for each transistor. Small variations in the operating point of the earlier stages may be amplified to cause profound changes in the later stages.

It has accordingly been the practice to provide D.C. negative feedback between the output from each transistor and its emitter-base input circuit to provide self-stabilization. Unfortunately, this expedient proves unworkable in the push-pull amplifier since the average voltages and currents existing in the collector-emitter circuit of a Class-B stage are dependent upon the amplitude of the applied A.C. signal. It is accordingly proven to be impractical to employ direct coupling between a Class-B, push-pull transistor amplifier and its driving amplifier while still providing the needed stabilization for the push-pull stage.

It is therefore a principal object of the present invention to provide means for directly coupling a transistorized, Class-B, push-pull amplifier to its input stage while, at the same time, providing excellent stabilization of the push-pull stage.

It is a further object of the invention to provide an improved, efficient, highly stable, and extremely compact transistor amplifier which is suitable for use in hearing aids and other devices where miniaturization is of substantial importance.

In a principal aspect the present invention takes the form of a novel transistor amplifier circuit having a push-pull stage whose input is directly coupled to the output of a phase-splitting differential amplifier. In accordance with a principal feature of the invention, the quiescent operating points of both stages are stabilized by providing a direct current feedback connection between the output of each transistor in the differential amplifier and its base electrode. The teachings of the present invention may be employed to produce an extremely compact, highly stable amplifier useful in connection with hearing aids and similar devices where miniaturization is important.

*Brief description of the drawing*

These and other objects, features and advantages of the present invention may be more clearly understood by considering the following detailed description. In the course of this description reference will frequently be made to the attached drawing in which:

The single figure of the drawing is a circuit schematic of a transistor hearing aid amplifier which embodies the principles and features of the invention.

*Description of the preferred embodiment*

The arrangement shown in the drawing is adapted to amplify the signal produced by a hearing aid microphone 1 to a level sufficient to drive the receiving earphone speaker coil 2. The amplifier comprises a microphone input transistor 4, an amplifying transistor 5, a differential phase-splitting amplifier composed of transistors 6 and 7 and a pair of push-pull output transistors 8 and 9.

The microphone 1 is serially connected with a capacitor 10 and a variable resistor 11 between the base and emitter electrodes of the transistor 4. Capacitor 10 provides a low-impedance path for the flow of signal current through the base-emitter circuit of transistor 4 while variable resistor 11 is employed as a volume control. The collector of transistor 4 is directly connected to the base of transistor 5. Likewise the collector of transistor 5 is directly connected to the base of transistor 6. The emitter of the P-N-P transistor 5 is connected to the positive terminal of a battery 13 by means of a resistance 14. The battery 13 constitutes the sole source of power for the amplifier. The collector of transistor 4 is connected to the positive terminal of battery 13 by means of a resistor 17.

The emitters of transistors 4, 6 and 7 are connected together at a common point. This common point is connected to the negative terminal of battery 13 by means of a resistor 18. The collector of transistor 5 is connected to the negative terminal of battery 13 by means of a resistor 20.

A resistor 25 connects the junction of the microphone 1 and the capacitor 10 to a feedback voltage supply point 26. This feedback voltage supply point 26 is connected by means of a resistor 27 to the collector of transistor 6 and to the positive terminal of battery 13 by means of a resistor 29.

A direct connection is made between collectors of the transistors 6 and 7 in the phase-splitting amplifier and the bases of transistors 8 and 9 respectively in the push-pull output amplifier. The speaker coil 2 is connected between the collectors of transistors 8 and 9. A center-tap connection on the coil 2 is directly connected to the positive terminal of battery 13. Capacitors 30 and 31 are respectively connected between the base and collector electordes of transistors 8 and 9 to provide a high-frequency "roll-off" characteristic for noise suppression and improved audio frequency performance.

The push-pull transistors 8 and 9 are driven in phase opposition by the differential amplifier comprising transistors 6 and 7. Resistors 33 and 34 are serially connected between the collector of transistor 7 and the positive terminal of battery 30. A resistor 35 connects the base electrode of transistor 7 to the junction of resistors 33 and 34. Alternating current components of the base biasing current flowing through resistor 35 are bypassed by capacitor 37 which is connected between the base of transistor 7 and ground.

The amplifier shown in the drawing employs direct coupled transistors to eliminate the need for interstage blocking capacitors and to provide excellent response throughout the desired audio frequency range. The ability of a direct coupled amplifier to respond to very slowly fluctuating potentials causes a significant difficulty. Temperature variations give rise to changes in the transistor operating characteristics thereby creating voltage level changes which are amplified in the several stages. For example, assume that each of the transistors in the amplifier shown in the drawing tends to become slightly more conductive due to a temperature change. The potential at the collector of transistor 4 therefore drops slightly. Were precautions not taken, this small shift in the operating point of transistor 4, when amplified, would cause a radical change in the operating point of the transistors in the following stages.

As contemplated by the present invention, a direct current feedback path having positive gain is connected between the collector circuit and the base of each transistor in the differential amplifier to stabilize both that amplifier and the push-pull output stage as well. The magnitude of this gain need not be greater than unity and is "positive" in the sense that no net phase reversal is exhibited by the path. Though the gain of the path is positive, the feedback is "negative" or degenerative since a net phase reversal is present between the collector and base-emitter circuit of the transistors. Thus a small change in the conductivity of tarnsistor 4, which would normally be amplified by transistors 5 and 6 to cause a relatively large change in the potential at the feedback point 26, instead causes a change in the base drive current flowing through resistor 25 to substantially cancel the original fluctuation. Similarly, a small change in the conductivity of transistor 6 causes a fluctuation in the voltage at feedback point 26 which is amplified by transistors 4 and 5 to substantially nullify the initial variation.

Although the transistors 6 and 7 in the differential amplifier are well stabilized, slight variations in the collector voltages of these transistors do occur with changes in temperature. These variations are used to advantage in stabilizing the push-pull transistors 8 and 9. The transistor pairs 4 and 8 and 7 and 9 are selected to have closely similar temperature characteristics. Thus, as a temperature change tends to increase the conductivity of transistor 4, the voltage at the collector of transistor 6 drops slightly even though stabilized by the provision of D.C. feedback. This slight decrease in potential is applied to the base of transistor 8 and counteracts the tendency of that transistor to exhibit a current increase. Although the voltage variations existing at the collector of transistor 6 are influenced to some extent by changes in the characteristics of transistors 5 and 6, influence by transistor 4 is dominant because the voltage level changes it creates are highly amplified. In the same manner, transistor 7 acts as a temperature sensor to stabilize transistor 9.

A better understanding of the operation of the embodiment of the invention shown in the drawing may be obtained by assigning specific values to the above-identified components so that reference may be made to specific voltage and current levels. It should be understood that considerable variation in these values is possible without changing the operation of the circuit and that they are by no means critical. Therefore, the following circuit element values are given, by way of example, for the amplifier shown in the drawing:

*Component list*

| | | |
|---|---|---|
| Capacitor 10 | mfd | 10 |
| Resistor 11 | ohms | 0 to 5,000 |
| Battery 13 | volts | 1.5 |
| Resistor 14 | ohms | 500 |
| Resistor 17 | do | 20,000 |
| Resistor 18 | do | 270 |
| Resistor 20 | do | 10,000 |
| Resistor 25 | do | 150,000 |
| Resistor 27 | do | 0 to 1,000 |
| Resistor 29 | do | 2,200 |
| Capacitors 30 and 31 | mfd | .004 |
| Resistor 33 | ohms | 3,300 |
| Resistor 34 | do | 0 to 1,000 |
| Resistor 35 | do | 25,000 |
| Capacitor 37 | mfd | 1.5 |

In order to understand the manner in which the operating points of the transistors are stabilized in accordance with the invention, it will be helpful to obtain a familiarity with the various voltage levels which exist at different points throughout the circuit in the quiescent condition—that is, when the microphone 1 is producing no audio frequency signal variations. Both transistors 6 and 7 are conductive and the resulting current flow through resistor 18 produces a voltage at the emitters of transistors 4, 6 and 7 equal to approximately .2 volt. Due to the substantially constant voltage drop across the base-emitter junctions of the transistors, the potential at the base electrodes of transistors 4, 6 and 7 is equal to approximately .75 volt. The potential at the collectors of transistors 6 and 7 and at the base electrodes of transistors 8 and 9 is approximately .55 volt. The value of resistance 27 is selected to produce a potential equal to approximately .75 volt at the feedback point 26. Because transistor 4 draws only approximately .25 microampere of base current, the base of transistor 4 and feedback point 26 are at essentially the same potential. Similarly, the potential at both the base of transistor 7 and at feedback point 27*a* is approximately .75 volt.

If, because of a temperature change, each of the six transistors in the amplifier becomes slightly more conductive, serious maladjustment of the operating points of the output transistors would result were it not for the stabilizing circuitry contemplated by the present invention. If transistor 4 became slightly more conductive, its collector potential would drop causing a resultant decrease in the collector-emitter impedance of transistor 5, thus increasing the base drive to transistor 6 by a substantial amount. This change would be further amplified to greatly reduce the drive to transistor 8. Because of the current gain involved, a very small shift in the conductivity of transistors 4 or 5 would cause a substantial change in the operating point of transistors 8 and 9.

As contemplated by the present invention, however, the operating points of all of the transistors are stabilized by the provision of a novel direct current feedback arrangement. Any increase in the conductivity of transistor 4 causes a decrease in the potential at its collector. This potential change is amplified by transistors 5 and 6 and fed to the base of transistor 4 to substantially cancel the change. Transistors 5 and 6 are stabilized in the same manner, any shift in the operating point being amplified and fed back to the base of the transistor to counteract the fluctuation. Similarly, the operating point of transistor 7 is stabilized by the feedback path through resistor 35. This counteracting relationship exists whenever the direct-current feedback path connects the input and output of an odd number of cascaded negative gain stages.

The voltages at the collectors of transistors 6 and 7 are directly applied to the bases of transistors 8 and 9 respectively. Although these voltages are stabilized at approximately .55 volt by the action of the direct current feedback paths, slight voltage changes do occur as a result of temperature changes. Thus, as the conductivity of transistor 7 tends to increase, the voltage at its collector drops slightly even though D.C. feedback is provided through resistor 35. Since transistor 9 has matching temperature characteristics, its conductivity tends to increase as well. The slight voltage drop produced at the collector of transistor 7 causes a reduction in base drive to transistor 9 with the net result that the operation of transistor 9 remains unchanged. Indeed, measurements indicate that the push-pull output stage transistors 8 and 9 are more accurately stabilized than the transistors 4 through 7 which are directly subject to the effects of the feedback.

The application of the principles of the invention accordingly permits the construction of a highly efficient, compact, and stable amplifier. The efficiency results from the Class-B configuration which draws power only to the extent of the applied signal. More complete miniaturization is made possible by the use of direct coupling, thereby eliminating the need for interstage coupling capacitors. The present invention allows these two known design techniques to be used jointly by solving the problem of operating point stabilization in the push-pull stage.

It is to be understood that the arrangement which has been described is merely illustrative of an application of the principles of the invention. Numerous modifications may be made to the embodiment described by those skilled in the art without departing from the true spirit and scope of the invention.

What is claimed is:

1. In combination:

first, second, third and fourth transistors each having base, emitter, and collector electrodes and each having similar temperature characteristics, means for connecting the emitters of said first and second transistors to a first common point, means for connecting the emitters of said third and fourth transistors together at a second common point, a common load circuit connecting the collectors of said third and fourth transistors to form a push-pull amplifier, separate collector circuits connecting the collectors of said first and second transistors to a source of operating potential to form a differential amplifier, a degenerative, direct current, feedback path connected between the base and collector circuit of both said first and second transistors, a direct connection between the collector of said first transistor and the base of said third transistor, a direct connection between the collector of said second transistor and the base of said fourth transistor, and a source of an input signal connected to the base of said first transistor.

2. A combination as set forth in claim 1 wherein said collector circuits comprise a pair of serially connected impedances and wherein said degenerative feedback paths are connected to the junction of said impedances.

3. A combination as set forth in claim 2 wherein each of said feedback paths comprise a resistance connected between the junction of said impedances and the base of the associated transistor.

4. A combination as set forth in claim 1 including means for suppressing the flow of alternating current signals through said feedback paths to prevent degeneration of said signals.

5. A combination as set forth in claim 1 wherein at least one of said feedback paths includes a plurality of direct-coupled transistor amplifiers.

References Cited

UNITED STATES PATENTS

| | | | |
|---|---|---|---|
| 2,943,266 | 6/1960 | Belland | 330—15 X |
| 3,229,217 | 1/1966 | Van Zeeland | 330—28 X |
| 3,280,342 | 10/1966 | Ashley | 330—28 X |

OTHER REFERENCES

Parmer: "Two Easy Ways to Stabilize Power-Transistor Hi-Fi Amplifiers," Electronics, pp. 56–58, Oct. 26, 1962.

JOHN KOMINSKI, *Primary Examiner*

L. J. DAHL, *Assistant Examiner.*

U.S. Cl. X.R.

330—28, 30